(12) United States Patent
Hsu et al.

(10) Patent No.: US 9,397,080 B2
(45) Date of Patent: Jul. 19, 2016

(54) PACKAGE ON PACKAGE DEVICES AND METHODS OF PACKAGING SEMICONDUCTOR DIES

(71) Applicant: Taiwan Semiconductor Manufacturing Company, Ltd., Hsin-Chu (TW)

(72) Inventors: Chun-Lei Hsu, Keelung (TW); Yu-Feng Chen, Hsin-Chu (TW); Ming-Che Ho, Tainan (TW); De-Yuan Lu, Taipei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/657,900

(22) Filed: Mar. 13, 2015

(65) Prior Publication Data
US 2015/0187746 A1 Jul. 2, 2015

Related U.S. Application Data

(62) Division of application No. 13/532,402, filed on Jun. 25, 2012, now Pat. No. 8,981,559.

(51) Int. Cl.
*H01L 21/00* (2006.01)
*H01L 25/00* (2006.01)
(Continued)

(52) U.S. Cl.
CPC ............ *H01L 25/50* (2013.01); *H01L 21/4857* (2013.01); *H01L 23/3121* (2013.01); *H01L 23/49811* (2013.01); *H01L 25/105* (2013.01); *H01L 23/49822* (2013.01); *H01L 24/16* (2013.01); *H01L 24/81* (2013.01); *H01L 2224/16225* (2013.01); *H01L 2224/16238* (2013.01); *H01L 2224/26175* (2013.01); *H01L 2224/32225* (2013.01); *H01L 2224/48227* (2013.01); *H01L 2224/73204* (2013.01); *H01L 2224/81* (2013.01); *H01L 2224/81193* (2013.01); *H01L 2224/81411* (2013.01); *H01L 2224/81444* (2013.01); *H01L 2224/81447* (2013.01);
(Continued)

(58) Field of Classification Search
CPC ........................................................ H01L 25/50
USPC .......................................................... 438/109
See application file for complete search history.

(56) References Cited

U.S. PATENT DOCUMENTS 6,018,197 A    1/2000 Saiki et al.
6,578,754 B1   6/2003 Tung
(Continued)

FOREIGN PATENT DOCUMENTS

KR    100722634    5/2007
KR    100744151    7/2007
(Continued)

*Primary Examiner* — Anthony Ho
(74) *Attorney, Agent, or Firm* — Slater Matsil, LLP

(57) ABSTRACT

A method of packaging semiconductor dies may include: coupling a first die to a first substrate; forming a plurality of first portions of a plurality of metal pillars on a surface of the first substrate; forming a second portion of the plurality of metal pillars over each of the plurality of first portions of the plurality of metal pillars; forming a protection layer over sidewalls of each of the plurality of first portions and second portions of the plurality of metal pillars; coupling a second die to a second substrate; and coupling the plurality of metal pillars to the second substrate.

20 Claims, 16 Drawing Sheets

(51) Int. Cl.
*H01L 23/31* (2006.01)
*H01L 25/10* (2006.01)
*H01L 23/498* (2006.01)
*H01L 21/48* (2006.01)
*H01L 23/00* (2006.01)

(52) U.S. Cl.
CPC .......... *H01L2224/81455* (2013.01); *H01L 2224/81464* (2013.01); *H01L 2224/81815* (2013.01); *H01L 2224/92125* (2013.01); *H01L 2224/97* (2013.01); *H01L 2225/0651* (2013.01); *H01L 2225/06565* (2013.01); *H01L 2225/1023* (2013.01); *H01L 2225/1058* (2013.01); *H01L 2225/1082* (2013.01); *H01L 2924/00* (2013.01); *H01L 2924/00012* (2013.01); *H01L 2924/10253* (2013.01); *H01L 2924/12042* (2013.01); *H01L 2924/1431* (2013.01); *H01L 2924/1434* (2013.01); *H01L 2924/157* (2013.01); *H01L 2924/15311* (2013.01); *H01L 2924/15321* (2013.01); *H01L 2924/15323* (2013.01); *H01L 2924/15331* (2013.01); *H01L 2924/15333* (2013.01); *H01L 2924/15788* (2013.01); *H01L 2924/18161* (2013.01); *H01L 2924/3651* (2013.01)

(56) References Cited

U.S. PATENT DOCUMENTS

| | | |
|---|---|---|
| 6,592,019 B2 | 7/2003 | Tung |
| 6,681,982 B2 | 1/2004 | Tung |
| 6,706,557 B2 | 3/2004 | Koopmans |
| 6,818,545 B2 | 11/2004 | Lee et al. |
| 2006/0157843 A1 | 7/2006 | Hwang |
| 2007/0013042 A1 | 1/2007 | Henel et al. |
| 2008/0088001 A1 | 4/2008 | Kim et al. |
| 2008/0142944 A1 | 6/2008 | Oi et al. |
| 2009/0206461 A1* | 8/2009 | Yoon .......... H01L 21/565 257/686 |
| 2010/0237484 A1 | 9/2010 | Han et al. |
| 2010/0327419 A1 | 12/2010 | Muthukumar et al. |
| 2011/0297983 A1 | 12/2011 | Nishiuchi et al. |
| 2012/0012991 A1 | 1/2012 | Chandrasekaran et al. |
| 2012/0104607 A1 | 5/2012 | Weng |

FOREIGN PATENT DOCUMENTS

| | | |
|---|---|---|
| TW | 200739875 | 10/2007 |
| TW | 200828565 | 7/2008 |
| TW | 201010049 | 3/2010 |
| TW | 201042750 | 12/2010 |
| TW | 201130105 | 9/2011 |
| TW | 201218335 | 5/2012 |
| TW | 201220534 | 5/2012 |

* cited by examiner

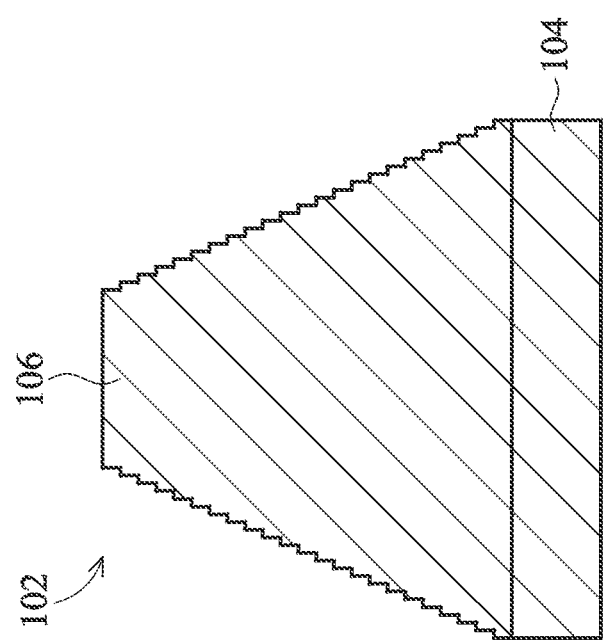

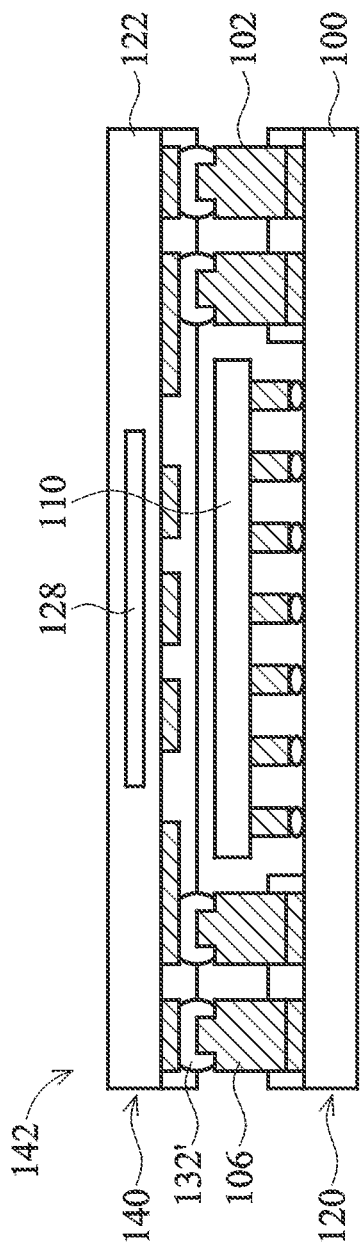
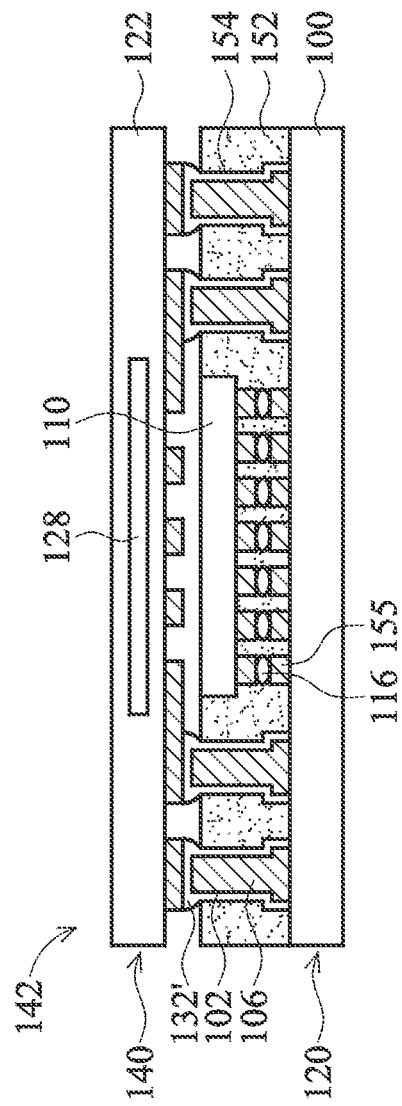

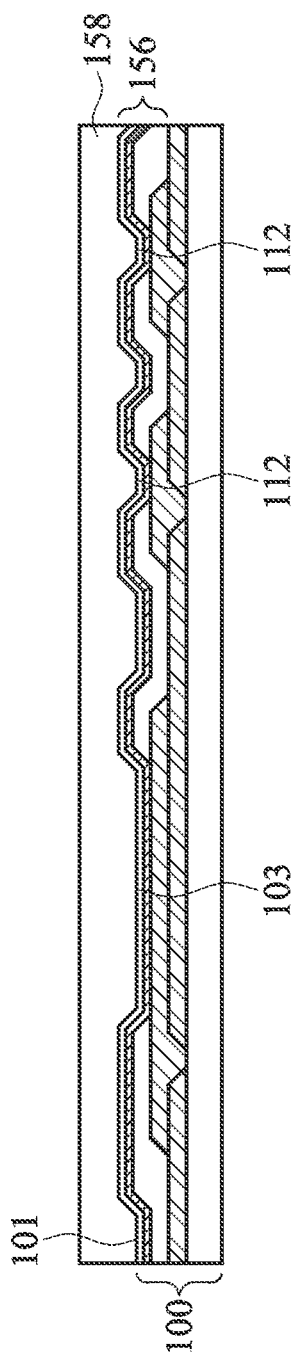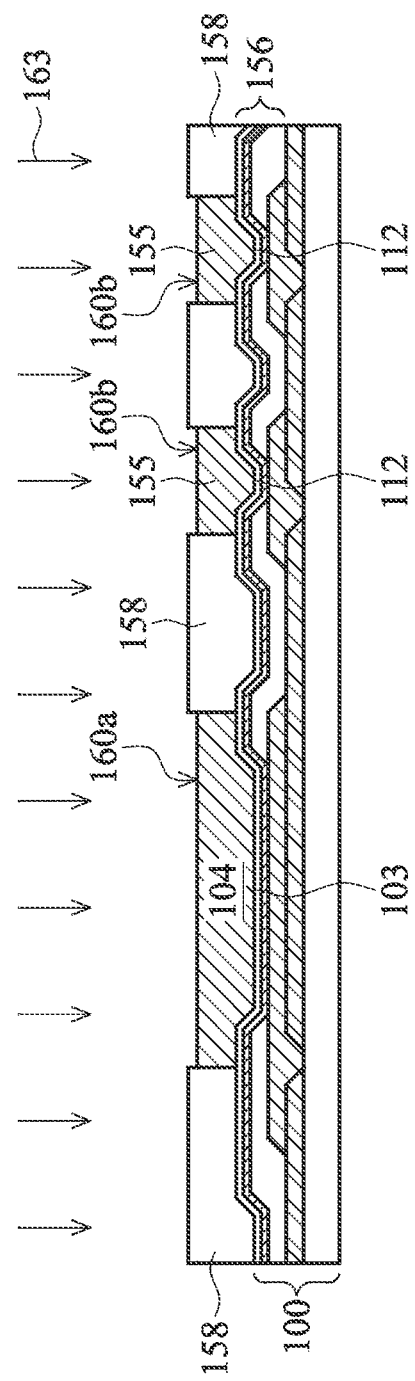

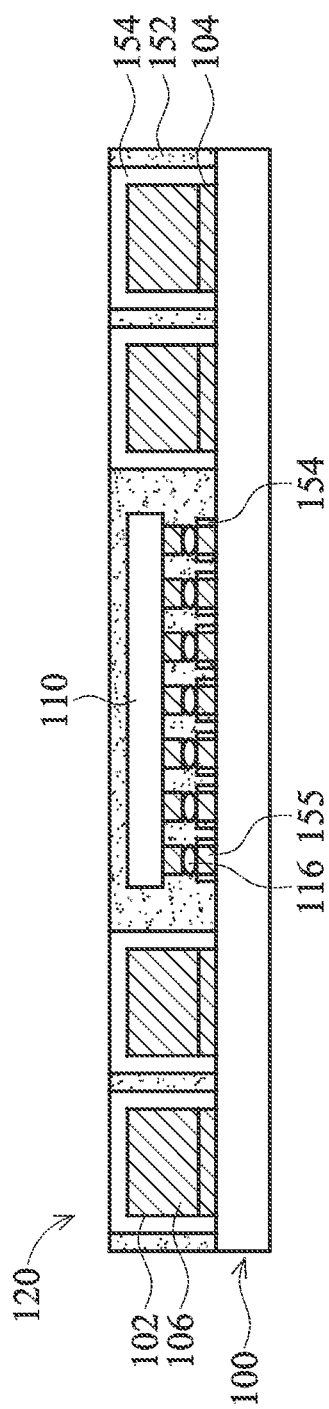
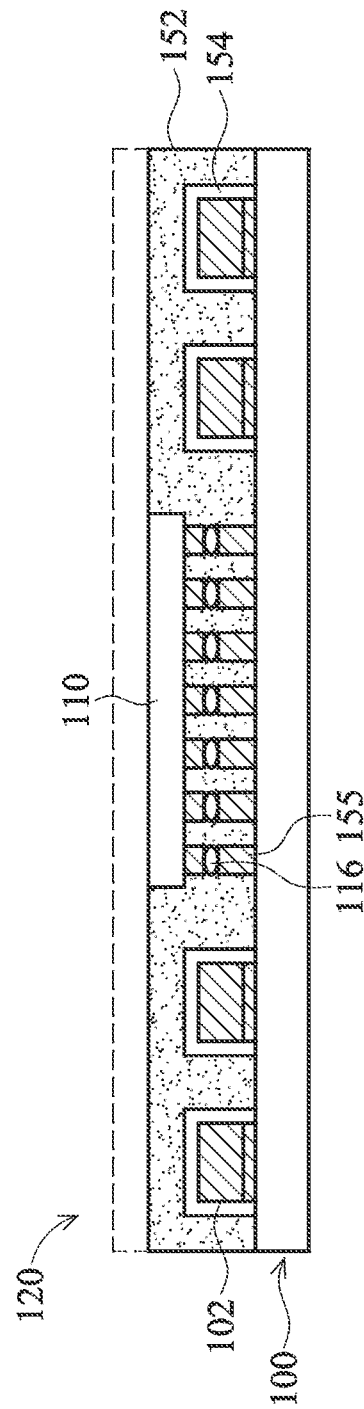
Fig. 18
Fig. 19

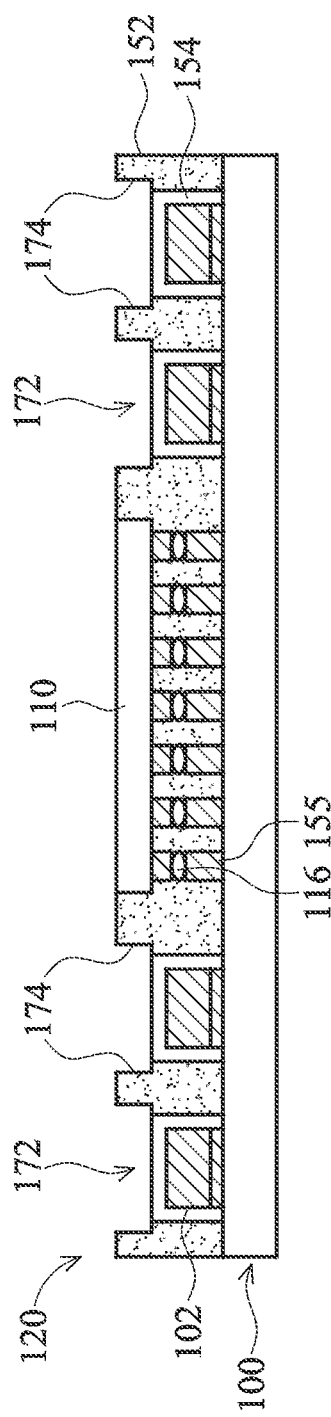
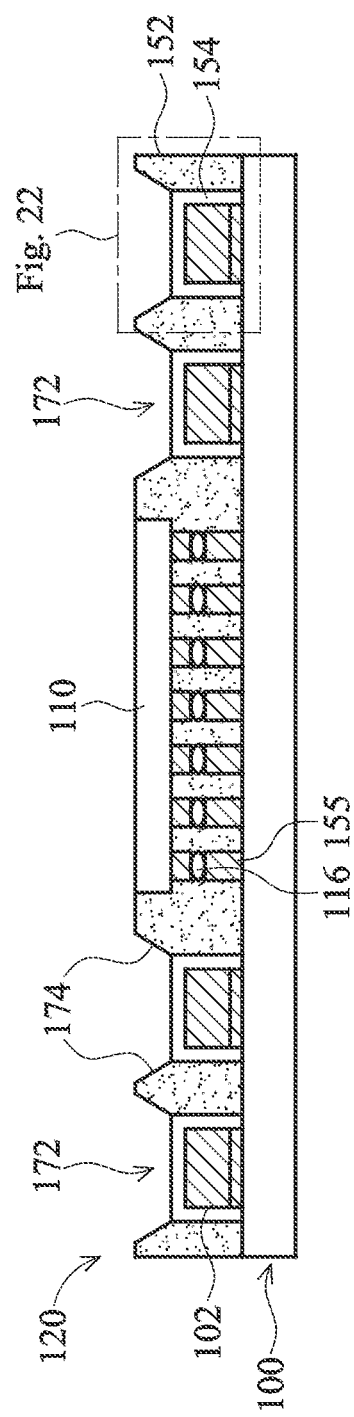

PACKAGE ON PACKAGE DEVICES AND METHODS OF PACKAGING SEMICONDUCTOR DIES

PRIORITY CLAIM AND CROSS-REFERENCE

This application is a divisional of U.S. patent application Ser. No. 13/532,402, entitled "Package on Package Devices and Methods of Packaging Semiconductor Dies," filed on Jun. 25, 2012, which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Package on package (PoP) technology is becoming increasingly popular for its ability to allow for denser integration of integrated circuits into a small overall package. PoP technology is employed in many advanced handheld devices, such as smart phones, for example.

Improved PoP packaging techniques are needed in the art.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 6 is a more detailed view of a ladder-shaped metal pillar shown in FIG. 5;

FIG. 7 shows a cross-sectional view of a PoP device packaged in accordance with another embodiment, wherein the metal pillars comprise a socket shape;

FIG. 8 is a cross-sectional view of a PoP device packaged in accordance with yet another embodiment, wherein the metal pillars comprise the shape of the letter "I";

FIGS. 9 through 13 illustrate cross-sectional views of a method of forming the metal pillars at various stages using a two-step plating process in accordance with an embodiment of the present disclosure;

FIGS. 16 through 18 illustrate cross-sectional views of methods of forming a protection layer over the metal pillars and forming a molding compound over the metal pillars and a bottom die in accordance with an embodiment;

FIGS. 19 through 21 show cross-sectional views of methods of forming the molding compound over the metal pillars and the bottom die, and opening the molding compound over the metal pillars so that electrical connections can be made to the metal pillars in accordance with embodiments of the present disclosure;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to packaging of semiconductor devices. Novel packaging structures and methods of packaging multiple semiconductor devices in PoP packages will be described herein. Note that for simplification, not all element numbers are included in each subsequent drawing; rather, the element numbers most pertinent to the description of each drawing are included in each of the drawings.

Figure 1:
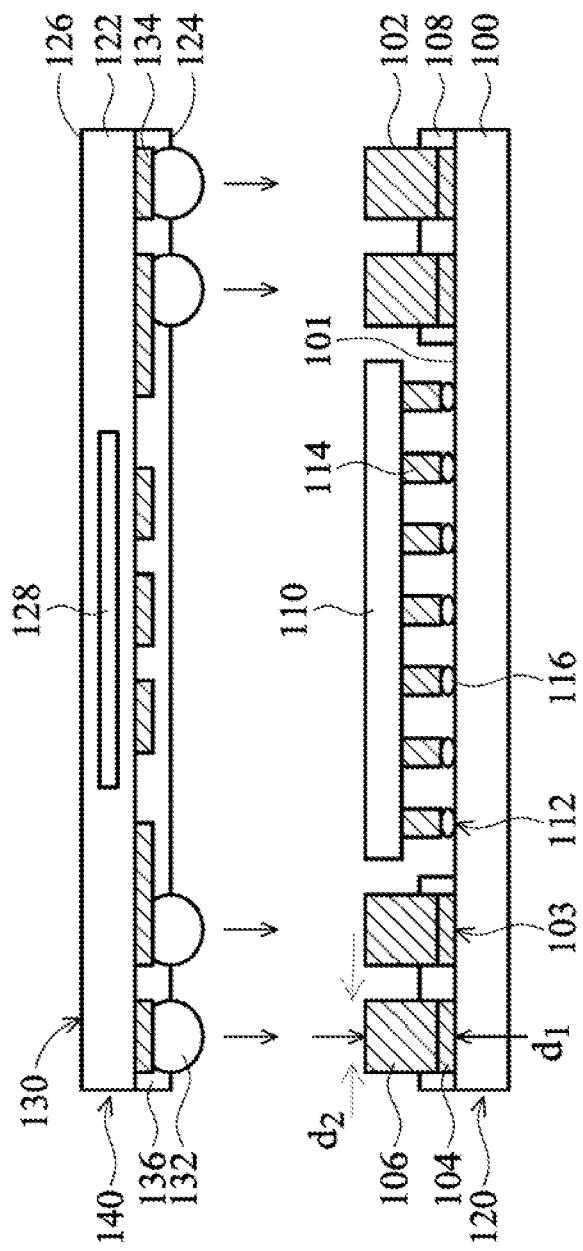
FIG. 1 illustrates a cross-sectional view of a method of attaching a top packaged die to a bottom packaged die having a plurality of metal pillars disposed thereon in accordance with an embodiment of the present disclosure.
Figure 2:
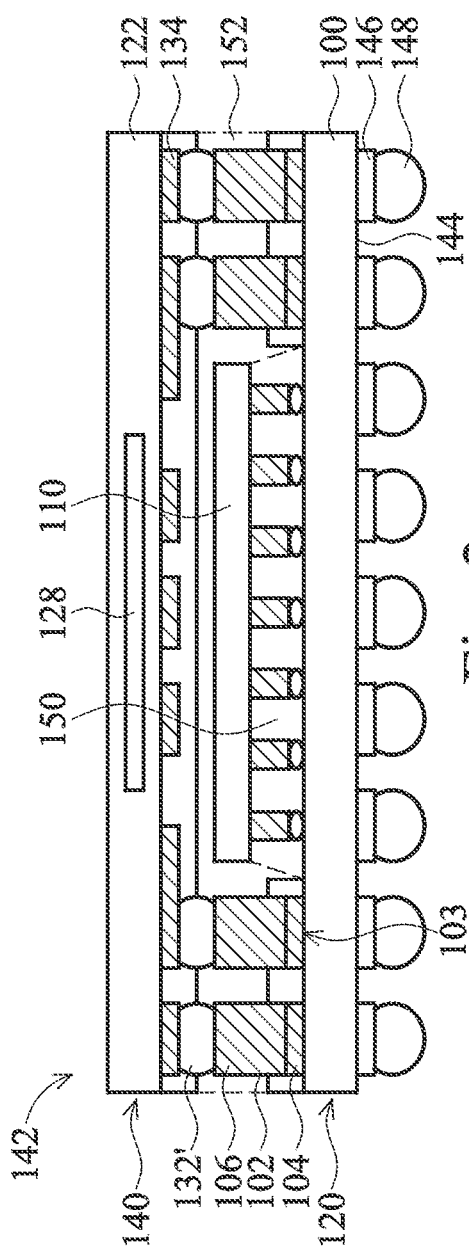
FIG. 2 is a cross-sectional view of a PoP device packaged in accordance with the method shown in FIG. 1.

FIG. 1 illustrates a cross-sectional view of a method of attaching a second (or top) packaged die 140 to a first (or bottom) packaged die 120 having a plurality of metal pillars 102 disposed thereon in accordance with an embodiment of the present disclosure. A first die 110 is packaged to form the first packaged die 120, and at least one second die 128 is packaged to form a second packaged die 140. The second packaged die 140 is then packaged with the first packaged die 120 by attaching solder balls 132 on the bottom surface 124 of the second packaged die 140 to the metal pillars 102 on the top surface 101 of the first packaged die 120, forming a PoP device 142, as shown in FIG. 2, which is a cross-sectional view of a PoP device 142 packaged in accordance with the method shown in FIG. 1.

Referring to FIG. 1, to package the first die 110, the first die 110 is attached to a substrate 100. First, a first substrate 100 is provided. Only one first substrate 100 is shown in the drawings; however, several first substrates 100 are processed on a workpiece comprising a plurality of first substrates 100, and the workpiece is later singulated, after packaging first dies 110 on the first substrates 100. The first substrate 100 comprises an interposer comprised of an insulating material or glass in some embodiments. In other embodiments, the first substrate 100 comprises a semiconductive material such as a semiconductor wafer. The first substrate 100 may include electronic components and elements formed thereon in some embodiments, or alternatively, the first substrate 100 may be free of electronic components and elements.

Bond pads and/or traces 103 comprising openings in wiring of the first substrate 100 are formed on the top surface of the first substrate 100 in a peripheral region of the first substrate 100 in a top view. Bond pads and/or traces 112 comprising openings in wiring are formed on the top surface of the first substrate 100 in a central region of the first substrate 100 in a top view. Bond pads and/or traces 103 and are shown in a more detailed view in FIG. 9. Bond pads 146 (not shown in FIG. 1; see FIG. 2) are formed on the bottom surface 144 of the first substrate 100. The bond pads 146 may be arranged in an array or in rows or columns on the bottom surface 144 of the first substrate 100, not shown. The bond pads 146 may fully populate the bottom surface 144 or may be arranged in various patterns, such as patterns used in ball grid array (BGA) or land grid array (LGA) package devices, as examples. The bond pads and/or traces 103 and 112 and bond pads 146 comprise a conductive material such as Al, Cu, Au, alloys thereof, other materials, or combinations and/or multiple layers thereof, as examples. Alternatively, the bond pads and/or traces 103 and 112, and bond pads 146 may comprise other materials.

The first substrate 100 may optionally include a plurality of through-substrate vias (TSVs) (not shown) formed therein in some embodiments. The TSVs comprise a conductive or semiconductive material that extends completely through the first substrate 100 may optionally be lined with an insulating material. The TSVs provide vertical electrical connections (e.g., y-axis connections in the view shown in FIG. 1) from a bottom surface to a top surface of the first substrate 100.

The first substrate 100 includes wiring 156 (see FIG. 9) formed within one or more insulating material layers. The wiring 156 provides horizontal electrical connections (e.g., x-axis connections in the view shown in FIG. 1) in some embodiments, for example. The wiring 156 may include fan-out regions that include traces of conductive material for expanding the footprint of the first die 110 to a footprint of the bottom side 144 of the first substrate 100, e.g., of the bond pads 146. The wiring 156 of the first substrate 100 may include one or more redistribution layers (RDLs). The RDLs may comprise one or more insulating layers and wiring layers. The RDLs may include inter-level dielectrics (ILDs) with wiring in metallization layers disposed or formed therein. The wiring 156 may comprise one or more vias and/or conductive lines, for example. The wiring 156 and the TSVs may be formed in the first substrate 100 using one or more subtractive etch processes, single damascene techniques, and/or dual damascene techniques, as examples. A portion of the wiring 156 may reside on the top and bottom surfaces of the first substrate 100; e.g., portions of the wiring 156 of the first substrate 100 may comprise the bond pads and/or traces 103 and 112 and bond pads 146 that are coupleable to other elements. Alternatively, the bond pads and/or traces 103 and 112 and bond pads 146 may be formed separately and attached to portions of the wiring 156, in other embodiments.

Referring again to FIG. 1, in accordance with embodiments of the present disclosure, a plurality of metal pillars 102 is attached to the bond pads and/or traces 103 on the top surface of the first substrate 100. The plurality of metal pillars 102 is formed using a two-step plating process, to be described further herein. The metal pillars 102 include a first portion 104 and a second portion 106 coupled to the first portion 104. The height of the first portion 104 in a vertical direction is thinner than the height of the second portion 106. The first portion 104 is disposed directly over the bond pads and/or traces 103. The second portion 106 is coupled to and disposed directly over the first portion 104 of each metal pillar 102. The metal pillars 102 comprise a height comprising dimension $d_1$ of about 200 μm or less in some embodiments. In other embodiments, dimension $d_1$ may comprise about 90 to 190 μm, as another example. The metal pillars 102 comprise a width comprising dimension $d_2$ of about 10 to 250 μm in some embodiments. Alternatively, dimensions $d_1$ and $d_2$ may comprise other values.

The plurality of metal pillars 102 comprises a conductive material, such as a metal. In some embodiments, the plurality of metal pillars 102 comprises Cu. In other embodiments, the metal pillars 102 (e.g., the first portion 104 and the second portion 106 of the metal pillars 102 comprise Cu; a Cu alloy; a combination of Cu, Ni, and solder; a combination of Cu and solder; and/or combinations thereof, for example. The metal pillars 102 may comprise a column shape, a cone shape, a ladder shape, a socket shape, a shape of a letter "I", or a shape of a letter "T" in a cross-sectional view, to be described further herein. The metal pillars comprise a column shape in FIGS. 1 and 2, for example. Alternatively, the metal pillars 102 may comprise other conductive materials and/or metals and the metal pillars 102 may comprise other shapes. The formation of the metal pillars 102 and additional dimensions thereof will be described further herein with reference to FIGS. 9 through 15.

Referring again to FIG. 1, the first die 110 is attached to the first substrate 100. The first die 110 comprises an integrated circuit or chip that will be packaged with a second die 128a and optionally also a third die 128b (not shown in FIG. 1; see FIG. 27) in a single PoP device 142. The first die 110 may include a workpiece that includes a semiconductor substrate comprising silicon or other semiconductor materials and may be covered by an insulating layer, for example. The first die 110 may include one or more components and/or circuits formed in and/or over the workpiece, not shown. The first die 110 may include conductive layers and/or semiconductor elements, e.g., transistors, diodes, capacitors, etc., also not shown. The first die 110 may comprise logic circuitry, memory devices, or other types of circuits, as examples. The first die 110 may include a plurality of contacts (not shown) formed on a bottom surface thereof.

A plurality of bumps 114 may be formed on the bottom surface of the first die 110, e.g., on the plurality of contacts on the bottom surface of the first die 110. The bumps 114 may comprise microbumps and the bumps 114 may each include a solder cap 116 formed thereon, as examples. The bumps 114 are also referred to herein as conductive bumps. The bumps 114 on the first die 110 are then attached to the bond pads and/or traces 112 on the top surface of the first substrate 100, as shown in FIG. 1. A solder reflow process is used to reflow the solder caps 116 on the solder bumps 114 and attach the first die 110 to the first substrate 100, electrically and mechanically attaching the bumps 114 to the bond pads and/or traces 112 of the first substrate 100, for example. The bumps 114 may alternatively be attached to the first substrate 100 using other methods. In some embodiments, the first die 110 is attached to the first substrate 100 using a flip-chip bond-on-trace (BOT) attachment technique. Alternatively, other flip-chip attachment techniques and other types of bond pads and/or traces 112 may be used.

The first substrate 100 is then singulated from other first substrates 100 on the workpiece, forming a first packaged die 120. The first packaged die 120 is also referred to herein in some embodiments as a bottom packaged die, for example. In some embodiments, the bottom packaged die 120 includes a plurality of solder balls 148 formed on bond pads 146 on the bottom surface 144 thereof, as shown in FIG. 2. Each of the plurality of metal pillars 102 is bonded to a bond pad and/or trace 103 on the top surface 101 of the bottom packaged die 120. Final tests are then performed on the first packaged die 120.

A second packaged die 140 is next provided. A cross-sectional view of a second packaged die 140 that includes a second die 128 packaged with a second substrate 122 is shown. Details of the second packaged die 140 are not shown in FIGS. 1 and 2; see FIG. 27. The second packaged die 140 includes the second die 128 disposed over the second substrate 122, and a bottom surface 124 including a plurality of bond pads 134 formed thereon. A molding compound 130 may be formed over the second die 128 at a top surface 126 thereof. The bond pads 134 comprise substantially the same footprint or layout as the metal pillars 102 on the first packaged die 120. A plurality of solder balls 132 is formed on the bond pads 134 in the embodiment shown in FIGS. 1 and 2. An insulating material 136 may optionally be formed between portions of the solder balls 132 and over exposed portions of the bond pads 134, as shown.

After the plurality of solder balls 132 is formed on the bottom surface 124 of the second substrate 122, the second substrate 122 is then singulated from other second substrates 122 on a workpiece (e.g., comprising a workpiece or strip of second substrates 122) the second substrate 122 was fabricated on, forming a second packaged die 140. Final tests are performed on the second packaged die 140.

The second packaged die 140 is lowered until the solder balls 132 are coupled to the metal pillars 102. Each of the plurality of metal pillars 102 on the top surface 101 of the first substrate 100 (e.g., comprising a bottom substrate) is coupled to a solder ball 132 on the bottom surface 124 of the second substrate 122 (e.g., comprising a top substrate). The solder balls 132 are reflowed, so that a solder joint 132' is formed on each of the metal pillars 102 proximate the second packaged die 140, as shown in FIG. 2, which is a cross-sectional view of a PoP device 142 packaged in accordance with an embodiment. The solder joints 132' have a substantially barrel shape in the cross-sectional view. A solder joint 132' is formed on a portion of each of the plurality of metal pillars 102. Each of the plurality of metal pillars 102 is at least partially embedded in a solder joint 132' at a top region of the second portion 106. The solder joint 132' may also extend over a portion of or over the entire first portion 104 of the metal pillars 102 in some embodiments, not shown in the drawings. The plurality of metal pillars 102 is disposed between the first packaged die 120 and the second packaged die 140, as shown. The solder joints 132' electrically couple together the bond pads and/or traces 103 of the first packaged die 120 and the contacts 134 of the second packaged die 120, and also mechanically couple together the first and second packaged dies 120 and 140.

Before the first packaged die and the second packaged die are attached, an optional underfill material 150 may be applied under the first die 110, between the first substrate 100 and the first die 110, as shown in phantom in FIG. 2. The underfill material 150 is applied using a dispensing needle along one or more edges of the first die 110, for example, although other methods may also be used to form the underfill material 150. The underfill material 150 comprises epoxy or a polymer in some embodiments, although other materials may alternatively be used.

A molding compound 152 may also optionally be formed between the first packaged die 120 and the second packaged die 140, also shown in phantom in FIG. 2. The molding compound 152 may be formed after the first packaged die and the second packaged die 140 are attached. Alternatively, the molding compound 152 may be applied at least between the metal pillars 102 before the first packaged die 120 and the second packaged die 140 are attached, to be described herein with reference to FIGS. 8, 18, and 19. The molding compound 152 may comprise similar materials described for the underfill material 150, for example. Alternatively, the molding material 152 may comprise other materials. The underfill material 150 may comprise a first molding compound that is formed over sidewalls of the first die 110, and the molding compound 152 may comprise a second molding compound that is formed over the first molding compound 150 and the first die 110, in some embodiments, for example.

A plurality of solder balls 148 may optionally be formed on the bottom surface of the first substrate 100, as shown in FIG. 2. The solder balls 148 are attached to the bond pads 146 on the bottom of the first substrate 100, before or after singulating the individual packaged dies 120, for example. The solder balls 148 may be formed using a ball mount process, followed by a solder reflow process, for example. The solder balls 148 may alternatively be formed using other methods.

Figure 3:
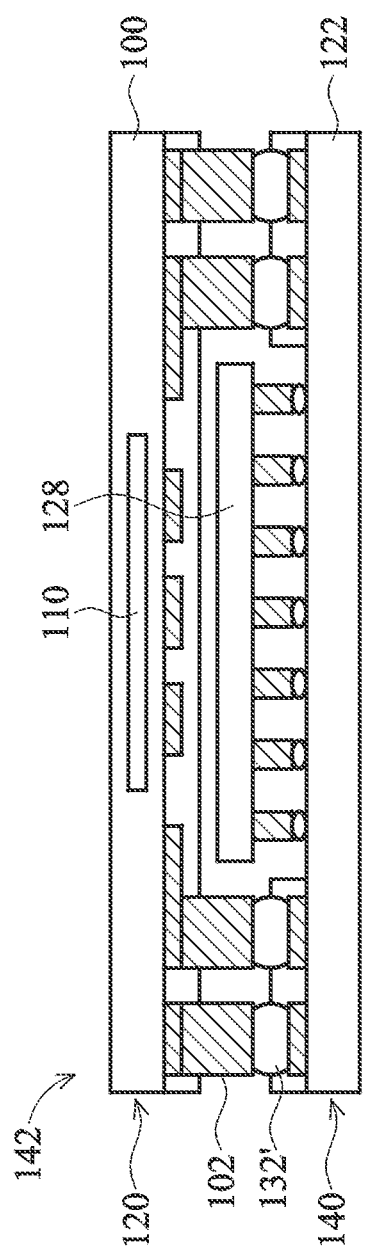
FIG. 3 shows a cross-sectional view of a PoP device packaged in accordance with another embodiment, wherein the metal pillars are disposed on the top packaged die.

In the embodiment shown in FIG. 2, the metal pillars 102 are formed on a first packaged die 120 that comprises a bottom packaged die, and solder balls 132 are formed on a second packaged die 140 that comprises a top packaged die. Alternatively, the metal pillars 102 may be formed on a first packaged die 120 that comprises a top packaged die, as shown in FIG. 3, which shows a cross-sectional view of a PoP device 142 packaged in accordance with another embodiment. Solder balls 132 (not shown in FIG. 3; see solder ball 132 in FIG. 1 and solder joint 132' in FIG. 3 after a reflow process of a solder ball 132) are formed on a second packaged die 140 that comprises a bottom packaged die. Each of the plurality of metal pillars 102 on the bottom surface of the first substrate 100 (e.g., comprising a top substrate) is coupled to a solder ball 132 on the top surface of the second substrate 122 (e.g., comprising a bottom substrate). The solder balls 132 become solder joints 132' after a solder reflow process to attach the first and second packaged dies 120 and 140 together.

Figure 4:
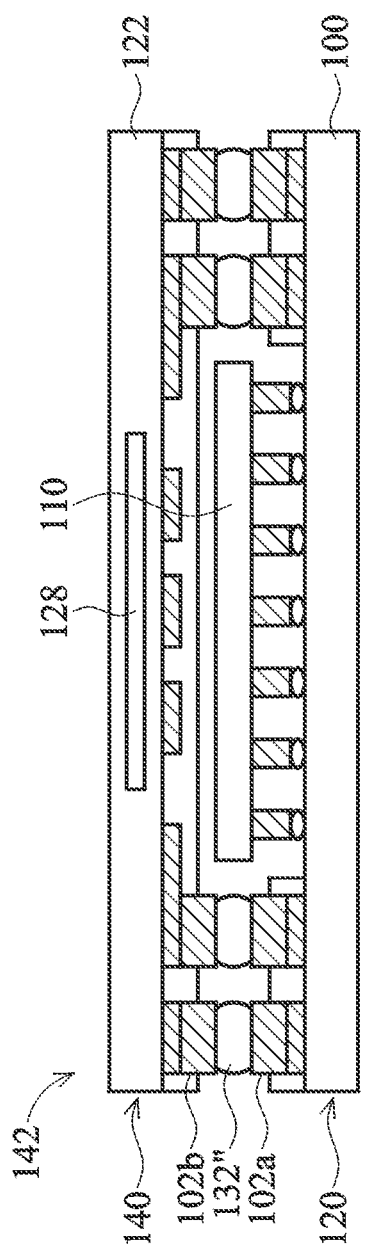
FIG. 4 is a cross-sectional view of a PoP device packaged in accordance with another embodiment, wherein metal pillars are disposed on both the top and bottom packaged dies.

In another embodiment, metal pillars may be disposed on both packaged dies 120 and 140. For example, FIG. 4 is a cross-sectional view of a PoP device 142 packaged in accordance with another embodiment, wherein metal pillars 102a and 102b are disposed on both the first and second packaged dies 120 and 140, respectively. Metal pillars 102a are also referred to herein as first metal pillars 102a, and metal pillars 102b are also referred to herein as second metal pillars 102b. A solder ball 132 (not shown in FIG. 4; see solder ball 132 in FIG. 1 and solder joint 132" in FIG. 4 after a reflow process of a solder ball 132) is formed on each of the plurality of first metal pillars 102a or on each of the plurality of second metal pillars 102b. A solder ball 132 may alternatively be formed on each of the plurality of first metal pillars 102a and on each of the plurality of second metal pillars 102b, for example. Each of the plurality of first metal pillars 102a is coupled to one of the plurality of second metal pillars 102b using a solder ball 132 formed on one of the plurality of first metal pillars 102a and/or a solder ball 132 formed on one of the plurality of second metal pillars 102b, and a solder reflow process is performed, forming the solder joints 132" shown in FIG. 4.

Figure 5:
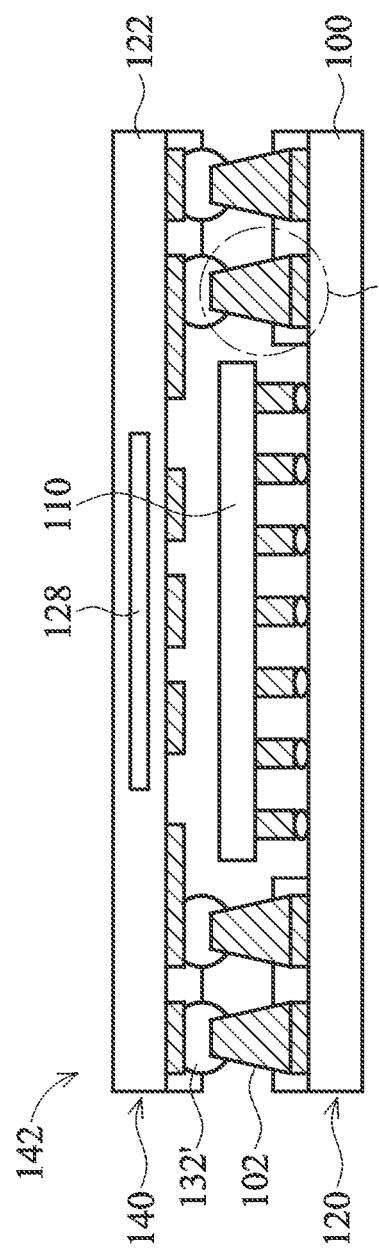
FIG. 5 illustrates a cross-sectional view of a PoP device packaged in accordance with yet another embodiment, wherein the metal pillars comprise a cone or ladder shape.

In the embodiments shown in FIGS. 1 through 4, the metal pillars 102, 102a, and 102b comprise a column shape. FIGS. 5 through 8 illustrate various alternative shapes of the metal pillars 102 in accordance with other embodiments. The shapes of the metal pillars 102 may be controlled using photolithographic processes of layers of photoresist (see FIGS. 10 through 12 at 158 and 152) prior to a plating process used to form the metal pillars 102. FIG. 5 illustrates a cross-sectional view of a PoP device 142 packaged in accordance with an embodiment wherein the metal pillars 102 comprise a cone or ladder shape. The metal pillars 102 are wider at the bottom than at the top. The sidewalls of the metal pillars 102 may be substantially straight, forming a cone shape, as shown in FIG. 5. Alternatively, the sidewalls of the metal pillars 102 may be stair-stepped and have a ladder shape, as shown in FIG. 6, which is a more detailed view of a metal pillar 102 shown in FIG. 5.

FIG. 7 shows a cross-sectional view of a PoP device 142 packaged in accordance with another embodiment, wherein the metal pillars 102 comprise a socket shape. The socket shape of the metal pillars 102 has a second portion 106 with a narrower top region that facilitates adhering with a solder ball 132. Portions of the solder joint 132' form around edges of the narrower top region of the second portion 106 of the socket-shaped metal pillars 102 after a reflow process.

FIG. 8 is a cross-sectional view of a PoP device packaged in accordance with yet another embodiment, wherein the metal pillars 102 comprise the shape of the letter "I". The I shape of the metal pillars 102 also has a second portion 106 with a narrower top region that facilitates adhering with a solder ball 132. Portions of the solder joint 132' form around edges of the narrower top region of the second portion 106 of the metal pillars 102. The solder ball 132 can be printed from a solder film or may comprise a smaller-sized ball than in other embodiments described herein, as examples. If the metal pillar 102 critical dimension (CD) is substantially the same as the solder ball 132 diameter or solder film width, the metal pillars can form an "I" shape, for example.

FIG. 8 also illustrates an optional protective material 154 (see also FIGS. 16 through 18, to be described further herein) that may be formed over top surfaces and sidewalls of the metal pillars 102 before coupling together the first and second packages dies 120 and 140. The protective material 154 comprises a conductive or organic material that remains at least on sidewalls of the metal pillars 102 after the solder reflow process to form the solder joints 132'. A portion of the protective material 154 may also remain at a top surface of the metal pillars 102 after the solder reflow process, as shown in FIG. 8.

Also shown in FIG. 8 is a molding compound 152 which is formed between the first packaged die 120 and the second packaged die 140. The molding compound 152 is formed over the first packaged die 120 before coupling together the first and second packages dies 120 and 140. Portions of the molding compound 152 are removed from a top region of the metal pillars 102 (see the embodiment shown in FIG. 26 and the description thereof) so that electrical and mechanical connections may be made to the solder balls 132 to form the solder joints 132'.

FIG. 8 further illustrates a plurality of contacts 155 formed on the first substrate 100 that are formed in a central region of the first substrate 100. The contacts 155 may optionally be formed simultaneously with the formation of first portions 104 of the metal pillars 102 in a first plating process accordance with some embodiments (to be described further herein with reference to FIGS. 9 through 13). The solder caps 116 on the first die 110 are coupled to the contacts 155 of the first substrate 100 in these embodiments, as shown. Each of the plurality of conductive bumps 114 is coupled to one of the plurality of contacts 155 in the central region of the substrate 100 by a solder cap 116.

FIGS. 9 through 13 illustrate cross-sectional views of a method of forming the novel metal pillars 102 using a two-step plating process in accordance with an embodiment of the present disclosure. A first substrate 100 previous described herein is first provided. A view of a portion of half of the first substrate 100 is shown that corresponds to a left side of FIG. 1. A more detailed view of the first substrate 100 is shown. Wiring layers 156 comprising conductive lines and/or vias formed in one or more insulating layers are disposed proximate a top surface of the first substrate 100. The wiring layers 156 may include one or more redistribution layer (RDLs) and may include under-ball metallization (UBM) structures, as examples. The wiring layers 156 may alternatively comprise a plurality of traces of conductive material formed in one or more conductive material layers of the substrate 100, as another example. Exposed portions of the wiring layers 156 comprise the bond pads and/or traces 103 and 112.

A first plating process 163 (see FIG. 10) is used to form first portions 104 of the metal pillars 102. In the first plating process, a first layer of photoresist 158 is formed over a surface (e.g., a top surface 101 in the embodiment shown) of the first substrate 100, as shown in FIG. 9. A plurality of first patterns 160a is formed in the first layer of photoresist 158 in the perimeter region of the surface 101 of the first substrate 100 using a first lithography process, as shown in FIG. 10. The first lithography process may comprise directly patterning the first layer of photoresist 158 using a laser or other energy beam in some embodiments. In other embodiments, the first lithography process may comprise patterning the first layer of photoresist 158 by exposing the first layer of photoresist 158 to light or energy transmitted through or reflected from a lithography mask (not shown) having a desired pattern thereon. The first layer of photoresist 158 is then developed, and exposed (or unexposed, depending on whether the first layer of photoresist 158 comprises a positive or negative resist) portions of the first layer of photoresist 158 are ashed and removed, leaving the portions of the first layer of photoresist 158 shown in FIG. 10 left remaining. The first patterns 160a in the first layer of photoresist 158 are disposed over bond pads and/or traces 103 of the wiring layer 156.

In some embodiments, as shown in the embodiment illustrated in FIG. 8, contacts 155 may optionally be formed in a central region simultaneously with the formation of first portions 104 of the metal pillars 102 in the first plating process. To form the contacts 155, a plurality of second patterns 160b is also formed in the first layer of photoresist 158 in the central region of the surface 101 of the first substrate 100 in the first lithography process, as shown in FIG. 10. The second patterns 160b in the first layer of photoresist 158 are disposed over the bond pads and/or traces 112 of the wiring layer 156.

A plurality of first portions 104 of the plurality of metal pillars 102 is formed in the plurality of first patterns 106a in the first layer of photoresist 158 using a first plating process 163, as shown in FIG. 10. A plurality of contacts 155 is also optionally simultaneously formed in the plurality of second patterns 106b in the first layer of photoresist 158 in the first plating process 163, also shown in FIG. 10. The first plating process 163 may comprise an electroplating process or an electro-less plating process, as examples. Alternatively, other types of plating processes may be used.

Figure 11:
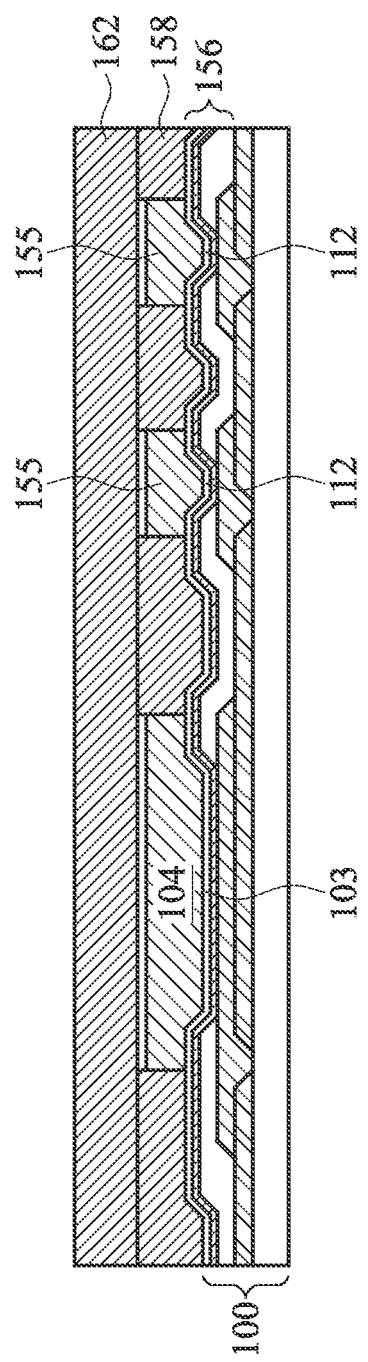
Figure 12:
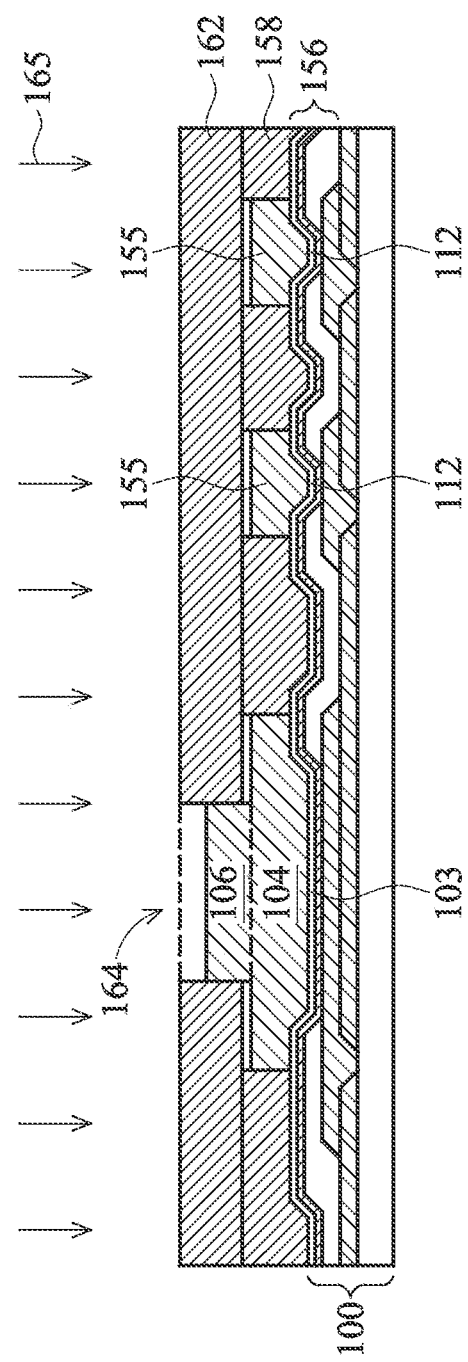

A second layer of photoresist 162 is formed over the plurality of first portions 104 of the plurality of metal pillars 102, the contacts 155, and the first layer of photoresist 158, as shown in FIG. 11. A plurality of second patterns 164 is formed in the second layer of photoresist 162 using a second lithography process, as shown in FIG. 12. Each of the plurality of second patterns 164 formed in the second layer of photoresist 162 is disposed over one of the plurality of first portions 104 of the plurality of metal pillars 102.

A plurality of second portions 106 of the plurality of metal pillars 102 is formed in the plurality of second patterns 164 in the second layer of photoresist 162 using a second plating process 165, also shown in FIG. 12. The second plating process 165 may comprise an electroplating process or an electro-less plating process. The second plating process 165 may comprise the same type or a different type of plating process than the first plating process 163, for example. The second portions 106 may partially fill the second patterns 164 in the second layer of photoresist 162, or the second portions 106 may substantially completely fill the second patterns 164 in the second layer of photoresist 162, as shown in phantom.

In accordance with embodiments, the shapes of the metal pillars 102 may be controlled by adjusting and selecting various parameters of photolithographic processes used to pattern the layers of photoresist 158 and 162 prior to the plating processes 163 and 165 used to form the metal pillars 102. For example, photo processes such as a beam focus and an exposure energy of the second lithography process used to form the second patterns 164 in the second layer of photoresist 162 may be controlled in accordance with embodiments to form second patterns 164 that achieve the column shape, cone shape, ladder shape, socket shape, "I" shape, or "T" shape of the second portion 106 of the metal pillars 102 in a cross-sectional view. When the second plating process 165 is used to fill the well-controlled second patterns 164, the metal pillars 102 fill the shape of the second layer of photoresist 162, forming the desired patterns of the metal pillars 102. Likewise, the shape of the first portions 104 of the metal pillars 102 may be controlled to achieve desired shapes.

Figure 13:
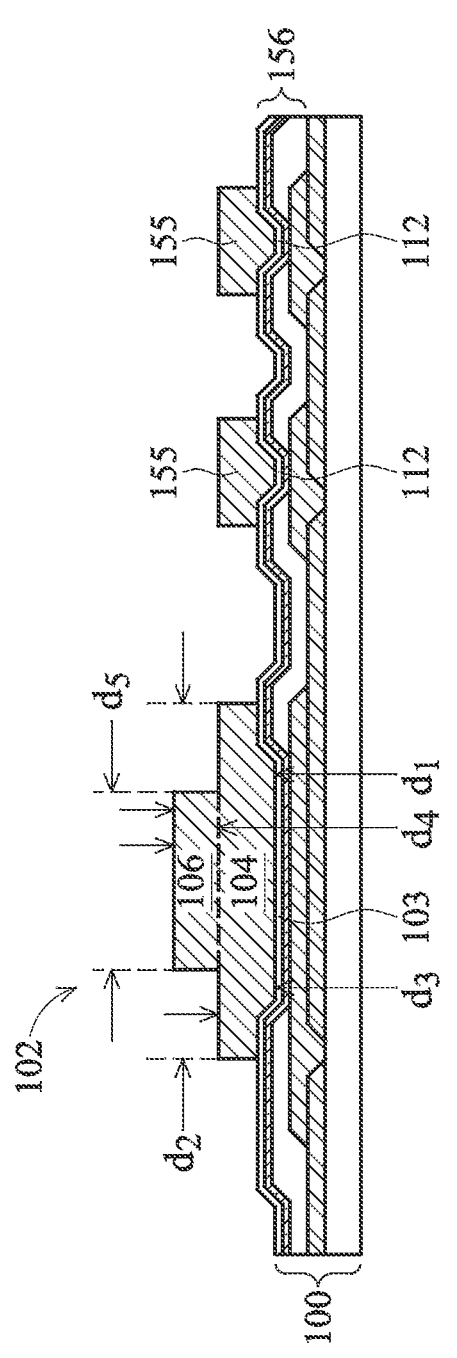

The second layer of photoresist 162 and the first layer of photoresist 158 are then removed as shown in FIG. 13, e.g., using a resist strip process. The shape of the metal pillar 102 formed by the first portion 104 and the second portion 106 comprises a shape of a letter "T" that is inverted in this example. The first portion 104 has a height comprising dimension $d_3$, wherein dimension $d_3$ comprises about 1 to 60 μm. The second portion 106 has a height comprising dimension $d_4$, wherein dimension $d_4$ comprises about 50 to 150 μm. Dimensions $d_3$ and $d_4$ may alternatively comprise other values. The total height of the metal pillar 102 comprises a dimension $d_1$ that is about equal to $d_3+d_4$. The first portion 104 has a width comprising dimension $d_2$, and the second portion 106 has a width comprising dimension $d_5$, in this embodiment, wherein dimension $d_2$ is larger than dimension $d_5$. In other embodiments, dimension $d_5$ may be substantially the same as dimension $d_2$, such as the embodiments shown in FIGS. 1 through 4.

Figure 14:
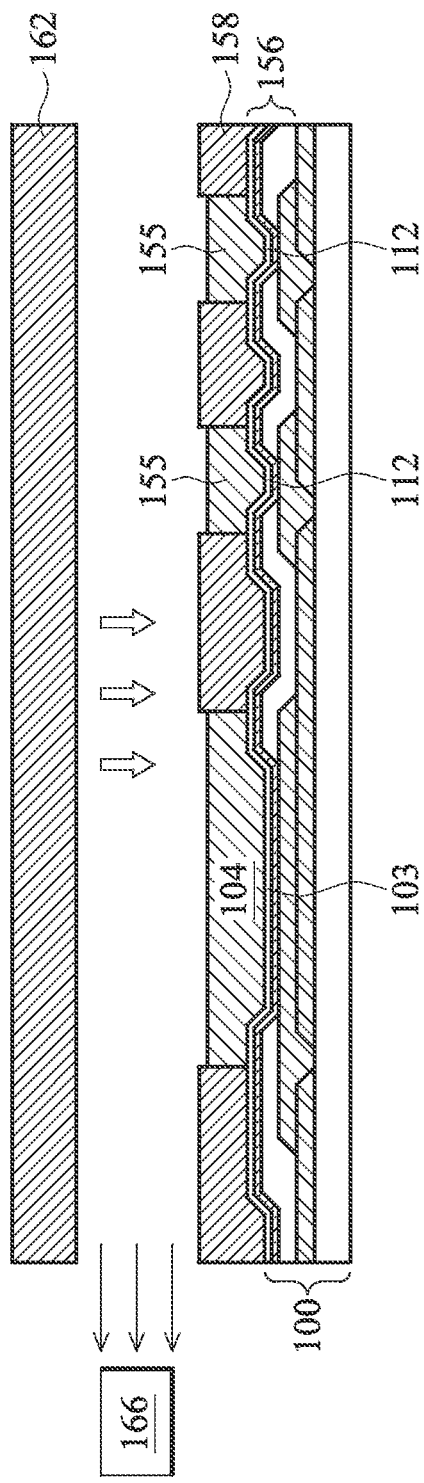
FIGS. 14 and 15 are cross-sectional views of an example of a method of forming a second layer of photoresist over a first layer of photoresist and a first portion of the metal pillars in accordance with embodiments of the present disclosure.
Figure 15:
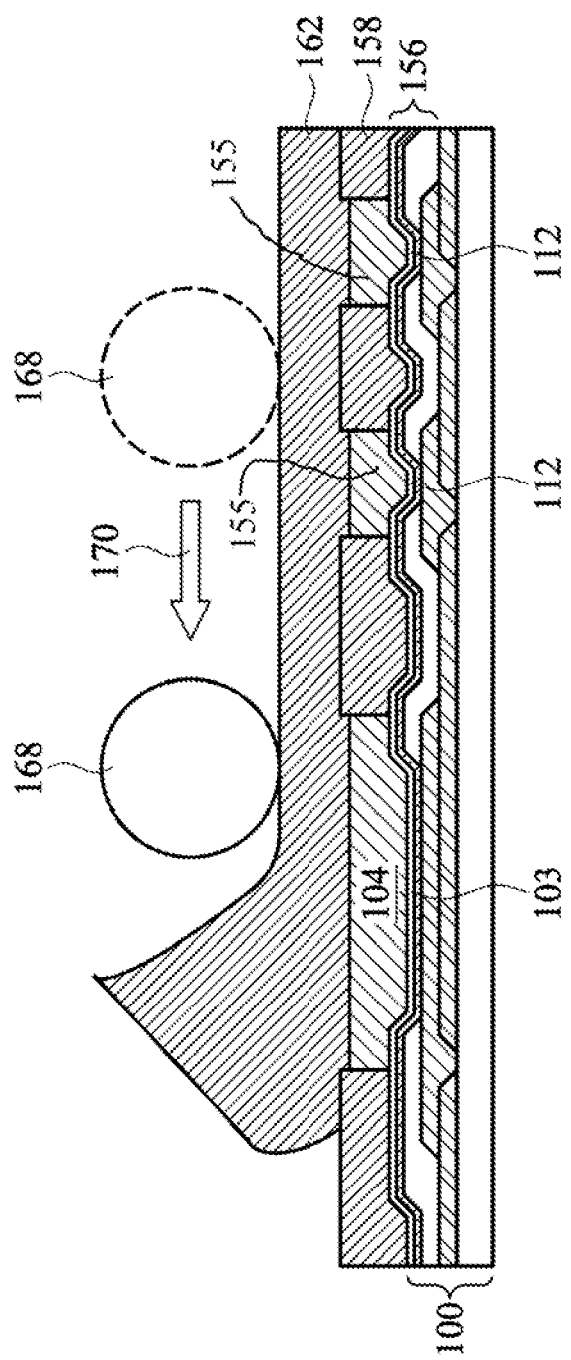

FIGS. 14 and 15 are cross-sectional views of an example of a method of forming a second layer of photoresist 162 over a first layer of photoresist 158 and a first portion 104 of the metal pillars 102 (and optionally over the contacts 155) in accordance with an embodiment. The second layer of photoresist 162 may comprise a dry film photoresist (DFR), although alternatively, the second layer of photoresist 162 may comprise others types of resists. In embodiments wherein the first plating process 163 does not completely fill the first patterns 160a and second patterns 160b, voids may form above the first portions 104 and the contacts 155 when applying the second layer of photoresist 162, particularly at corners proximate the first layer of photoresist 158 where there is a step height. To avoid such void formation, in some embodiments, the second layer of photoresist 162 is applied in the presence of a vacuum 166, as shown in FIG. 14. A roller 168 is used to apply pressure to a top surface of the second layer of photoresist 162 while rolling the roller 168 in a direction 170 in the vacuum 166 ambient, as shown in FIG. 15, laminating the second layer of photoresist 162 to the underlying materials. Rolling the second layer of photoresist 162 in the presence of the vacuum 166 advantageously results in no voids being formed over the top surfaces of the first portions 104, the contacts 155, and the first layer of photoresist 158, and also results in improved photolithography results.

In some embodiments, the first layer of photoresist 158 comprises a wet photoresist. The use of the vacuum 166 ambient is advantageous in these embodiments, because the second layer of photoresist 162 comprising a DFR may be placed close to the first layer of photoresist 158, and the vacuum 166 may be allowed to pull the second layer of photoresist 162 onto the first layer of photoresist 158 without contacting the second layer of photoresist 162, after which the roller 168 is used, achieving a very close contact of the second layer of photoresist 162 onto the first portions 104, the contacts 155, and the first layer of photoresist 158.

Figure 16:
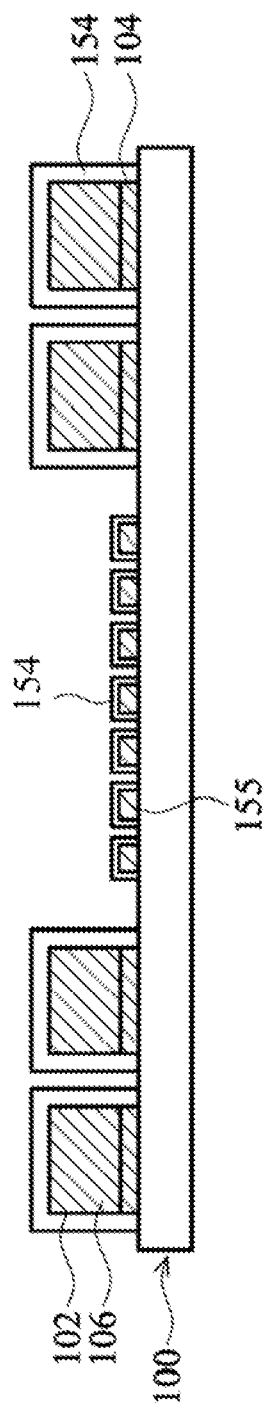
Figure 17:
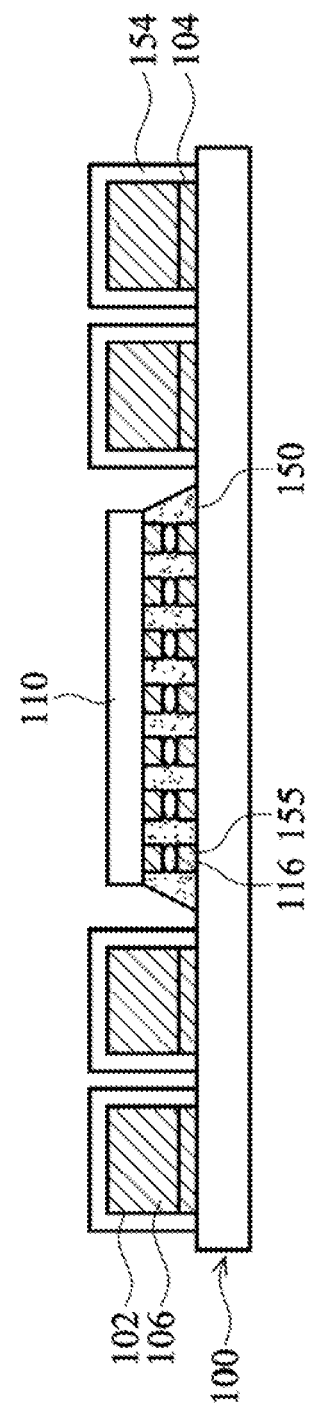

FIGS. 16 through 18 illustrate cross-sectional views of methods of forming a protection layer 154 over the metal pillars 102 and forming a molding compound 152 over the metal pillars 102 and the first die 110 in accordance with embodiments. The optional protection layer 154 comprises a material such as Sn, Au, CuGe, Cu, Ni, Pd, an organic solderability preservative (OSP), or combinations thereof, as examples. The protection layer 154 may be formed in some embodiments using an immersion process, such as an immersion tin (Sn) process or an OSP process. The protection layer 154 may also be formed by an electroless process, such as an electroless nickel immersion gold (ENIG) process or an electroless nickel electroless palladium immersion gold (ENEPIG) process. The protection layer 154 may also be formed using a chemical vapor deposition (CVD) process, e.g., to form CuGe. The protection layer 154 may comprise a thickness of about 10 μm or less, and may comprise about 1 to 2 μm in some embodiments, depending on the materials and formation process. Alternatively, the protection layer 154 may comprise other materials, may be formed using other methods, and may comprise other dimensions.

The protection layer 154 may optionally be formed over the metal pillars 102 in the perimeter region of the substrate, and the protection layer 154 may also be simultaneously formed over the contacts 155 in the central region of the substrate for the first die 110, as shown in FIG. 16. In other embodiments, the protection layer 154 is formed only on the metal pillars 102, as shown in FIG. 17. To avoid forming the protection layer 154 on the contacts 155, the first die 110 is attached to the contacts 155 on the substrate 100, and an underfill material 150 is applied under the first die 110. Then, the protection layer 154 is formed over the sidewalls and top surfaces of the metal pillars 102 in the perimeter region of the substrate 100. In embodiments wherein the protection layer 154 is formed on the contacts 155 in the central region of the substrate 100, the first die 110 is attached to the contacts 155 having the protection layer 154 formed thereon, as shown in FIG. 18. A molding compound 152 is then formed over the substrate 100, over the first die 110, and between the metal pillars 102 having the protection layer 154 formed thereon. The soldering process to attach the solder caps 116 to the contacts 155 may result in the protection layer 154 being removed or being absorbed into the solder joints formed during the soldering process, as shown. Alternatively, the protection layer 154 may remain on the top surface of the contacts 155.

The soldering process for the top surface of the metal pillars 102 in a subsequent processing step used to attach the metal pillars 102 to the solder balls 132 on the second packaged die 140 may likewise result in the protection layer 154 being removed from over the top surfaces of the metal pillars 102 or being absorbed into the solder joints 132' or 132'' formed during the soldering process. Alternatively, the protection layer 154 may remain on the top surface of the metal pillars 102 after the soldering process, as shown in the embodiment illustrated in FIG. 8.

The use of a molding compound 152 between the first packaged die 120 and the second packaged die 140 is advantageous in some applications because the requirement for an underfill material 150 may be avoided. Alternatively, an underfill material 150 may also be used under the first die 110 when a molding compound 152 is used, as shown in the embodiment illustrated in FIG. 2.

FIGS. 19 through 21, FIGS. 25, and 26 show cross-sectional views of methods of forming the molding compound 152 over the metal pillars 102 and the first die 110, and opening the molding compound 152 over the metal pillars 102 so that electrical connections can be made to the metal pillars 102 in accordance with embodiments of the present disclosure.

In FIG. 19, a first packaged die 120 is shown after a molding compound 152 has been applied. The molding compound 152 may comprise a liquid molding compound (LMC) in some embodiments, as an example. Alternatively, the molding compound 152 may comprise other materials. The molding compound 152 may comprise a top surface that is substantially coplanar with a top surface of the first die 110. Alternatively, the molding compound 152 may reside over the top surface of the first die 110, as shown in phantom in FIG. 19. In either case, if the molding compound 152 resides over top surfaces of the metal pillars 102 in the perimeter regions of the substrate 100, the molding compound 152 needs to be removed so that electrical connections and mechanical connections can be made to solder balls 132 on the second packaged die 140.

FIG. 20 illustrates one method of removing the molding compound 152 from the top surfaces of the metal pillars 102, wherein the openings 172 in the molding compound 152 comprise a vertical shape. The openings 172 are formed by laser drilling the molding compound 152. The sidewalls 174 of the openings have a vertical shape in this embodiment. The openings 172 may be slightly wider than the top surface of the metal pillars 102, as shown, or may comprise other dimensions, such as the substantially the same as, or slightly smaller than the width of the top surface of the metal pillars 102.

FIG. 21 illustrates another method of removing the molding compound 152 from the top surfaces of the metal pillars 102, wherein the openings 172 in the molding compound 152 comprise a cambered or angled shape. The openings 172 are also formed by laser drilling the molding compound 152. The sidewalls 174 of the openings 172 have a cambered shape that may be substantially smooth in this embodiment. Alternatively, the sidewalls 174 of the openings 172 may have a ladder shape, as shown in a more detailed view in FIG. 22, which illustrates a ladder shaped opening 172 over a metal pillar 102 shown in FIG. 21. This opening 172 shape (and also the other opening 172 shapes described and to be described herein) may be used to extend a moisture penetration path, e.g., to the metal pillars 102, in some embodiments, by designing the opening 172 so that it is equal to or larger than a critical dimension (CD) of the metal pillar 102, to prevent joint necking.

Figure 22:
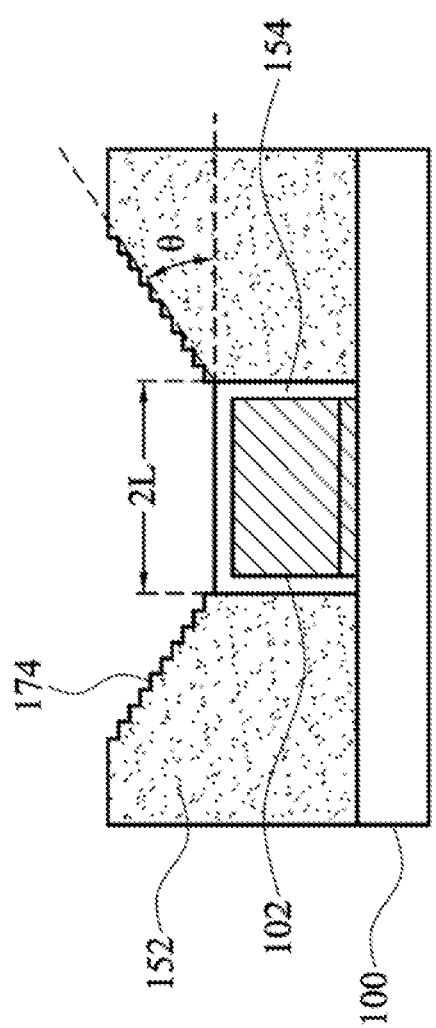
FIG. 22 shows a more detailed view of an cambered opening over a metal pillar shown in FIG. 21.
Figure 24:
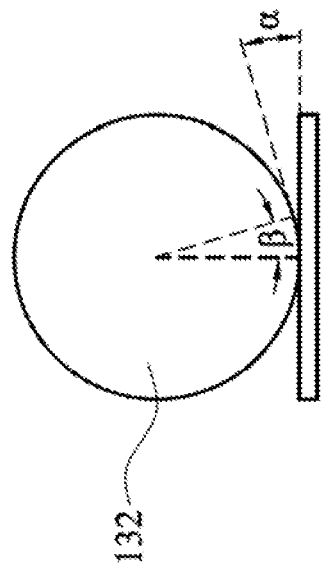
FIGS. 23 and 24 illustrate laser drilling calculations of various angles that may be used to determine the angle of the cambered opening shown in FIG. 22 based on solder ball dimensions and metal pillar width.
Figure 23:
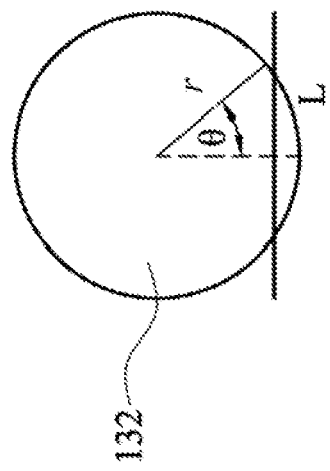

For example, in FIG. 22, the metal pillar width is labeled 2L, wherein L=metal pillar width/2. FIGS. 23 and 24 illustrate laser drilling calculations of various angles, to determine the angle θ of the cambered sidewalls 174. The opening 172 sidewall 174 angle θ is based on the metal pillar 102 CD and the solder ball 132 size on the second packaged die 140. For example, the opening 172 sidewall 174 angle θ may be calculated using the geometry concept shown in FIG. 24, wherein angle α=angle β. Applying this geometrical concept to FIGS. 22 and 23, the solder ball 132 radius r and L may be used to determine θ using the equation:

$$\theta = \sin^{-1}$$

which, applied to the dimensions in FIGS. 22 and 23, results in the equation:

$$(L/r) = L/r(180/\pi),$$

which equation may be used to determine an optimal angle θ of the cambered sidewalls 174 of the opening 172, in this embodiment. Alternatively, the angle θ may be determined using other methods.

Figure 25:
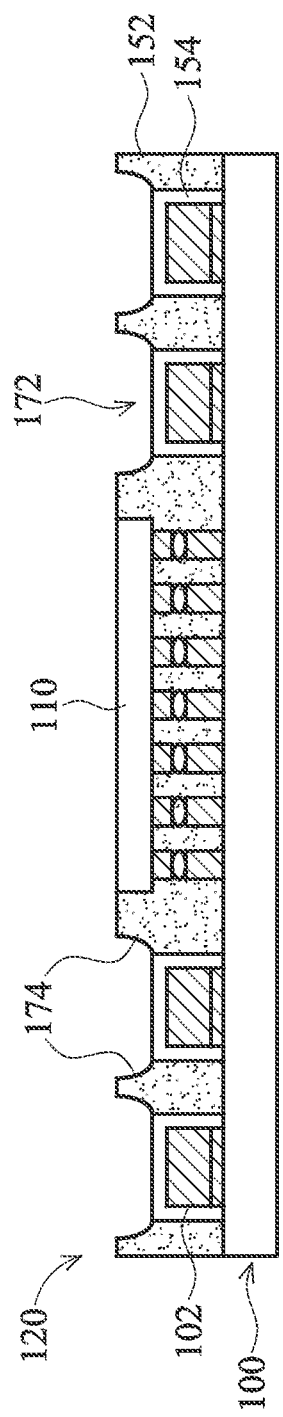
FIGS. 25 and 26 show cross-sectional views of methods of opening the molding compound over the metal pillars in accordance with other embodiments.

FIG. 25 illustrates another method of removing the molding compound 152 from the top surfaces of the metal pillars 102, wherein the openings 172 in the molding compound 152 comprise a curved shape. The openings 172 are again formed by laser drilling the molding compound 152. The sidewalls 174 of the openings have an upwardly bowled shape in this embodiment, similar to a shape of the solder ball 132 on the second packaged die 140 which advantageously also prevents moisture penetration.

Figure 26:
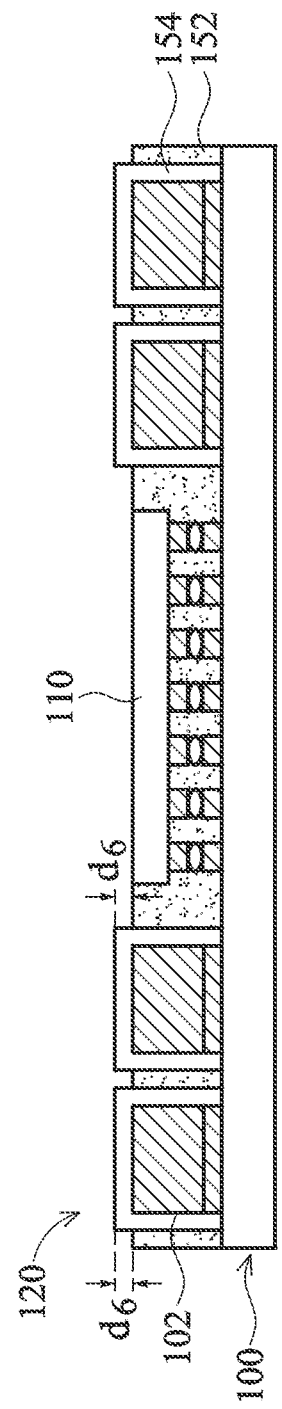

In other embodiments, the molding compound 152 may be opened from over the metal pillars 102 using a chemical-mechanical polish (CMP) process and/or by grinding, so that a top surface of the metal pillars 102 protrudes from above a top surface of the metal pillars 102, as shown in FIG. 26. This embodiment does not require drilling the molding compound 152. An endpoint detector can be implemented in the CMP and/or grinding process to determine when the top surface of the metal pillars 102 has been reached. The molding compound 152 may be recessed below the top surface of the metal pillars 102 by a dimension $d_6$, wherein dimension $d_6$ comprises about a few to several µm or less, as an example. Alternatively, dimension $d_6$ may comprise other values. The embodiment shown in FIG. 8 illustrates a first packaged die 120 wherein the molding compound 152 was removed from over the top surface of the metal pillars 102 using this embodiment, as one example. In some embodiments, dimension $d_6$ may be equal to zero, wherein the top surface of the molding compound 152 is substantially coplanar with the top surfaces of the metal pillars 102, as another example. The CMP process or grinding process can be used to remove a portion of the molding compound 152 and form an air exit space between the first die 110 and the second packaged die 140 in some embodiments, for example.

Figure 27:
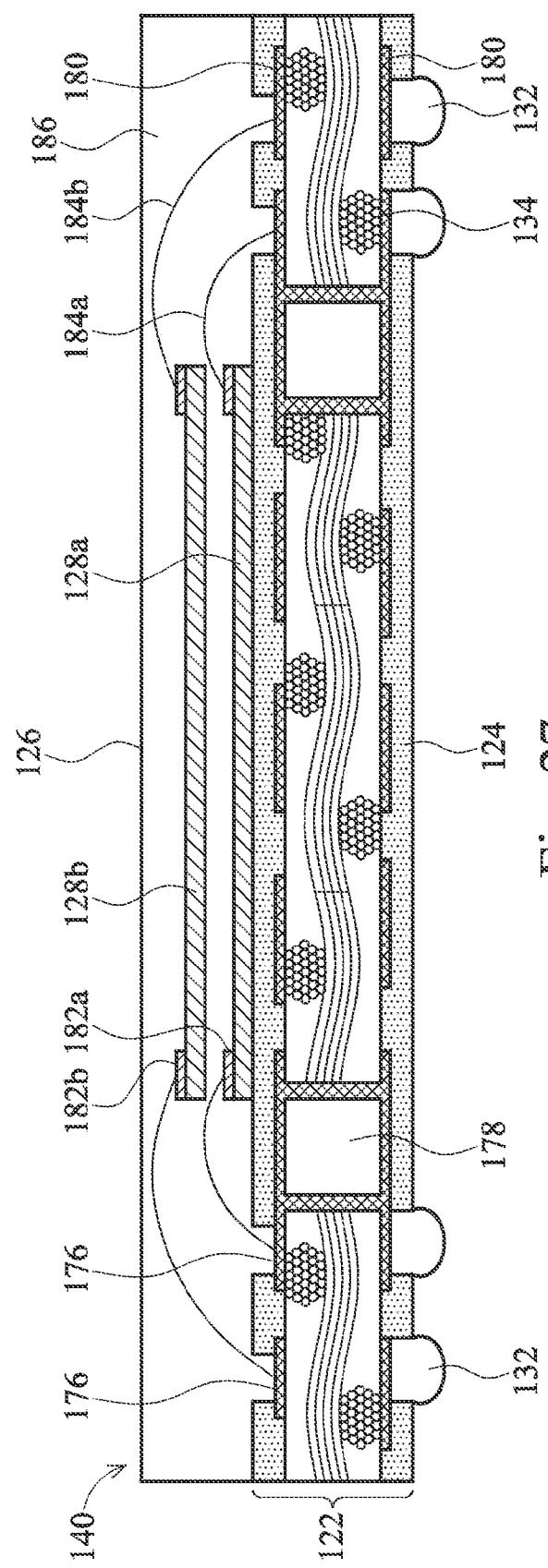
FIG. 27 is an example of a top packaged die in accordance with an embodiment that includes a plurality of top dies packaged over a top substrate.

FIG. 27 is an example of a second packaged die 140 in accordance with an embodiment that includes a plurality of top dies 128a and 128b packaged over a second substrate 122.

More details of the second substrate 122 are also shown in FIG. 27. To package a single second die 18a or two or more second dies 128a and 128b, a second substrate 122 is provided, which may comprise a substrate similar to the first substrate 100 described herein and which may comprise similar materials and components as the first substrate 100. The second substrate 122 may comprise a plurality of second substrates 122 formed on a strip or workpiece (not shown). The second substrate 122 may include TSVs 178 and wiring 180 similar to the TSVs and wiring 156 described for the first substrate 100. The second substrate 122 includes contact pads 176 on the top surface in a perimeter region and contacts 134 on the bottom surface. The contact pads 176 and contacts 134 may comprise similar materials described for the bond pads and/or traces 103 and 112 and bond pads 146 of the first substrate 100, for example.

Next, a second die 128a is provided, which may comprise a die similar to that described for the first die 110, for example. The second die 128a is attached to the top surface of the second substrate 122. The second die 128a includes a plurality of contacts 182a on a top surface thereof in a perimeter region. The second die 128a is attached to the top surface of the second substrate 122 using a glue or adhesive, not shown. The second die 128a is then electrically connected to the second substrate 122 using wire bonds 184a along two or more edges of the second die 128a. The second die 128a may be wire bonded along all four edges to the second substrate 122, for example. The second die 128a is attached to the top surface of the second substrate 122 by wire-bonding contacts 182a on a top surface of the second die 128a to contact pads 176 on the top surface of the second substrate 122 using the wire bonds 184a.

In some embodiments, only one second die 128a is coupled to the second substrate 122, and then a molding compound 186 is formed over the second die 128a and top surface of the second substrate 122, not shown in FIG. 27. In other embodiments, two second dies 128a and 128b are coupled over the second substrate 122, as shown in FIG. 27. A plurality of second dies 128a and 128b (or three or more second dies, not shown) may be stacked vertically over one another, above the second substrate 122, for example. In other embodiments, a plurality of second dies 128a and 129b (or three or more second dies) may be coupled horizontally over the second substrate 122, not shown in the drawings.

The second die 128b is also referred to herein as a third die. The third die 128b is coupled over the second die 128a, e.g., attached to the top surface of the second die 128a using a glue or adhesive. Contacts 182b on a top surface of the third die 128b are wire bonded using wire bonds 184b to contact pads 176 on the top surface of the second substrate 122. The third die 128b is wire bonded to the second substrate 122 similar to the wire bonding of the second die 128a to the second substrate 122 described herein, for example. Two or more rows of contact pads 176 may be formed on the top surface of the second substrate 122. The inner-most row of contact pads 176 is wire bonded to the second die 128a, and the outer-most row of contact pads 176 is wire bonded to the third die 128b, as shown in FIG. 27. A molding compound 186 is formed over the third die 128b and exposed portions of the second substrate 122. The molding compound 186 comprises an insulating material that protects the wire bonds 184a and 184b, for example. The molding compound 186 may comprise similar materials described for the molding compound 152, for example. Alternatively, the molding compound 186 may comprise other materials.

In some embodiments, the second dies 128a and 128b are packaged on the second substrate 122 using a flip-chip wafer level packaging (WLP) technique and wire bonding process, for example. Alternatively, the second dies 128a and 128b may be packaged on the second substrate 122 using other types of packaging processes.

In some embodiments, the second substrate 122 may not include an RDL in the wiring 180. All or some of the x-axis or horizontal electrical connections may be made using wire bonds 184a and 184b, in these embodiments. In other embodiments, the second substrate 122 may include an RDL in the wiring 180, as another example. All or some of the x-axis or horizontal electrical connections may be made in the RDL in these embodiments.

After the molding compound 186 is applied, a plurality of solder balls 132 is formed on the bottom surface of the second substrate 122, e.g., the solder balls 132 are coupled to the contacts 134, as shown in FIG. 27. The second substrate 122 is then singulated from other second substrates 122 on the strip or workpiece the second substrate 122 was fabricated on, forming a second packaged die 140. Final tests are performed on the second packaged die 140. Solder balls 132 of the second packaged die 140 are then attached to the metal pillars 102 on the first packaged die 120 described herein, forming a PoP package 142, as shown in FIGS. 2, 4, 5, 7, and 8.

Figure 28:
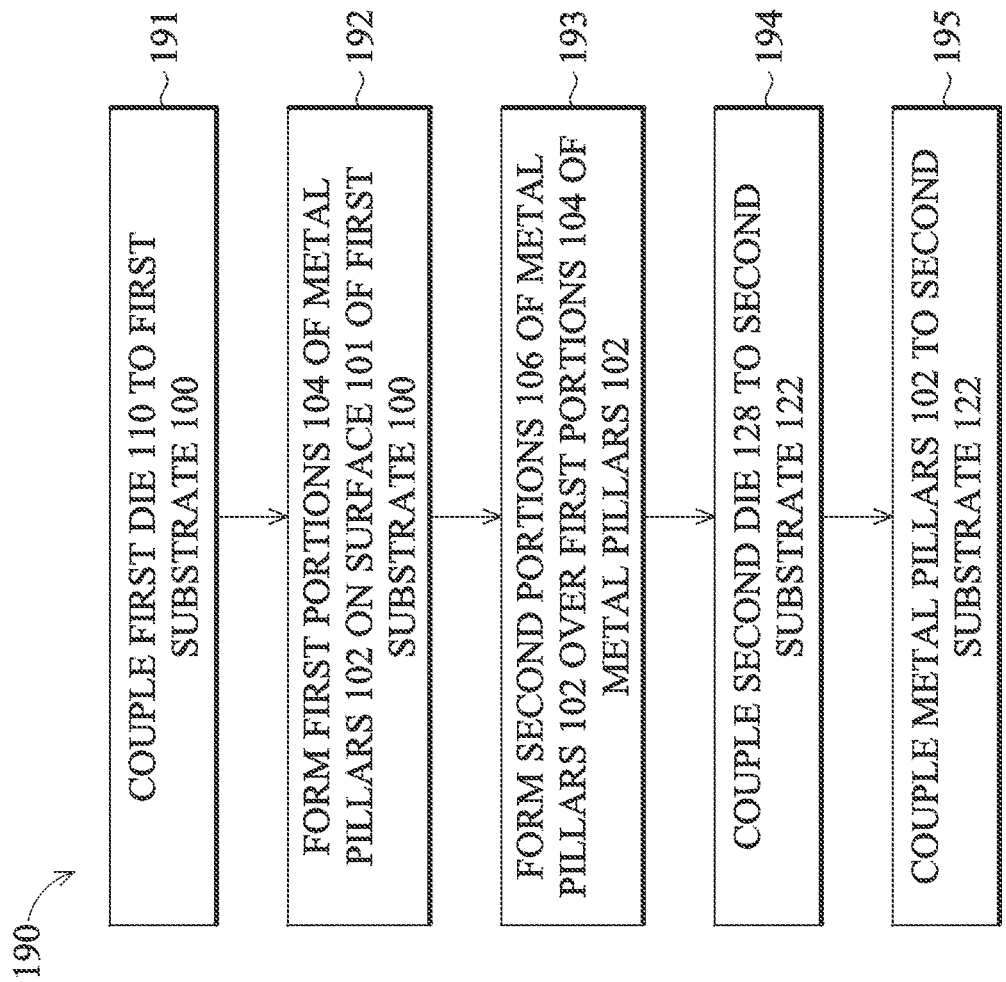
FIG. 28 is a flow chart illustrating a method of packaging multiple semiconductor dies in accordance with an embodiment of the present disclosure.

FIG. 28 is a flow chart 190 illustrating a method of packaging multiple semiconductor dies (i.e., first dies 110, second dies 128a, and optionally also third dies 128b) in accordance with an embodiment of the present disclosure. In step 191, a first die 110 is coupled to a first substrate 100. In step 192, first portions 104 of metal pillars 102 are formed on the surface 101 of the first substrate 100. In step 193, second portions 106 of the metal pillars 102 are formed over the first portions 104 of the metal pillars 102. In step 194, a second die 128 is coupled to a second substrate 122. In step 195, the metal pillars 102 are coupled to the second substrate 122.

In some embodiments, the second dies 128, 128a, and 128b described herein comprise memory devices such as random access memories (RAM) or other types of memory devices, and the first die 110 comprises a logic device. Alternatively, the second dies 128a and 128b and the first die 110 may comprise other functional circuitry. A different method may be used to attach the second dies 128, 128a, and 128b to the second substrate 122 than is used to attach the first die 110 to the first substrate 100. Alternatively, the same method may be used to attach the first die 110 to the first substrate 100 that is used to attach the second dies 128, 128a, and 128b to the second substrate 122.

In some embodiments, the second dies 128, 128a, and 128b are packaged using a flip-chip WLP technique and wire bonding, and the first die 110 is packaged using a flip-chip and BOT technique, as an example. The second dies 128, 128a, and 128b may also be packaged using a flip-chip and BOT technique, as another example. Alternatively, the second dies 128, 128a, and 128b and the first die 110 may be packaged using other methods or techniques.

The underfill material 150 and/or the molding compound 152 shown in FIG. 2 may optionally be included in all of the embodiments described herein, not shown in all of the drawings. The bond pads 146 and solder balls 148 may also be included on the bottom of each PoP package 142 described herein, also not included in each drawing. The various shapes of the metal pillars 102 described herein may alternatively be formed on a top packaged die as described for the embodiment shown in FIG. 3 and/or may alternatively be formed on both a top package die and a bottom packaged die, as described for the embodiment shown in FIG. 4. The protection layer 154 may be included or excluded on the metal pillars 102 or on both the metal pillars 102 and the contacts 155 in each of the embodiments described herein. Furthermore, the various shapes of openings 172 in the molding compound 152 over the metal pillars 102 described herein may be utilized with any of the various shapes of metal pillars 102 described herein.

Embodiments of the present disclosure include methods of packaging multiple semiconductor devices (e.g., first dies 110, second dies 128a, and optionally also third dies 128b) in a single PoP device 142 using novel plated metal pillars 102 in the electrical connections (e.g., the solder joints 132' and 132") between the first packaged dies 120 and the second packaged dies 140. Embodiments of the present disclosure also include PoP devices 142 that include the novel metal pillars 102 described herein.

Advantages of embodiments of the disclosure include providing novel process methods for fine-pitch PoP packages 142 and innovative methods for PoP packaged die 120 and 140 interconnection using novel plated metal pillars 102. The metal pillars 102 are formed using a novel two-step plating process. The plating processes 163 and 165 can be altered as desired by packaging designers for different metal pillar 102 shapes, such as a ladder shape, socket shape, I shape, and other shapes described herein, which provide improved structural strength, eliminate or reduce the chance of lithography misalignment, and allow for implementation of a finer pitch. The metal pillars 102 and packaging methods achieve improved mechanical resistance and improved electromigration performance, resulting in fewer solder joint 132' and 132" cracks after thermal stress or drop tests and reduced reliability problems. The packaging processes described herein have a reduced thermal budget with fewer solder reflow steps (e.g., compared to solder ball-to-solder ball joints), resulting in reduced defects (such as voids and delaminations) and less contamination, such as out-gassing.

Improved package coplanarity is achievable by the use of the novel plated metal pillars 102. Coplanarity of less than about 6 µm across an interface between the first package dies 120 and the second packaged dies 140 for a 20×20 mm² PoP package 142 is achievable using the metal pillars 102 described herein, as an example. The solder joints 132' and 132" easily reform their original solder ball 132 shape after the solder reflow process used to attach the second packaged dies 140 to the first packaged dies 120. The metal pillars 102 also result in reduced heating between the top packaged dies 140 and the bottom packaged dies 120, by functioning as an additional inter-thermal heatsink.

The PoP packages 142 including the metal pillars 102 described herein may be produced with very low costs due to process simplification, providing a cost savings in the packaging process. The solder material of the solder balls 132 may utilize a low alpha solder that emits a reduced amount of alpha particles, further reducing manufacturing costs by not requiring a metal finish. The use of a low alpha solder for the solder balls 132 also provides safer working conditions in the packaging environment and in fabrication facilities. Alpha counts of less than about 0.0002 counts per hour (cph)/cm² are achievable using the packaging techniques and novel metal pillars 102 described herein, for example.

The presence of portions of the metal pillars 102 in the solder joints 132' and 132" facilitate in the prevention of bridging of adjacent solder joints 132' and 132". The metal pillars 102 increase a bridging window of the PoP packages 142, reducing or preventing shorts, improving device yields, and allowing for the development of finer pitch PoP packages 142. The novel PoP structures and designs described herein are easily implementable in semiconductor device packaging process flows. The various features and advantages of the plated metal pillars 102 and packaging methods described herein result in improved package reliability and longer package lifetime.

In embodiments wherein the contacts 155 are formed simultaneously with the first plated layer (the first portions 104 of the metal pillars 102), further reduced costs are achieved, by avoiding an additional manufacturing step to form the contacts 155. The optional protection layer 154 protects the metal pillar 102 from oxidation and humidity, and prevents degradation of the metal pillar 102 from subsequent post-thermal processing such as laser drilling and molding. The protection layer 154 also promotes adhesion to subsequently formed underfill materials 150 and molding compounds 152, and prevents inter-metal compound (IMC) formation, such as Cu—Sn, in some embodiments.

In accordance with one embodiment of the present disclosure, a PoP device includes a first packaged die and a second packaged die coupled to the first packaged die. A plurality of metal pillars is coupled to the first packaged die. Each of the plurality of metal pillars includes a first portion proximate the first packaged die and a second portion disposed over the first portion. Each of the plurality of metal pillars is coupled to a solder joint proximate the second packaged die.

In accordance with another embodiment, a PoP device includes a first packaged die and a second packaged die coupled to the first packaged die. A plurality of metal pillars is coupled to the first packaged die. Each of the plurality of metal pillars includes a first portion proximate the first packaged die and a second portion disposed over the first portion. Each of the plurality of metal pillars is coupled to a solder joint proximate the second packaged die. Each of the plurality of metal pillars comprises a shape of a letter "I" in a cross-sectional view.

In accordance with yet another embodiment, a method of packaging semiconductor dies includes coupling a first die to a first substrate, and forming a plurality of first portions of a plurality of metal pillars on a surface of the first substrate. A second portion of the plurality of metal pillars is formed over each of the plurality of first portions of the plurality of metal pillars. The method includes coupling a second die to a second substrate, and coupling the plurality of metal pillars to the second substrate. Each of the plurality of metal pillars comprises a shape of a letter "I" in a cross-sectional view.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of packaging semiconductor dies, the method comprising:
    forming a plurality of first portions of a plurality of metal pillars on a major surface of a first substrate;
    forming a second portion of the plurality of metal pillars over each of the plurality of first portions of the plurality of metal pillars;
    forming a protection layer over sidewalls of each of the plurality of first portions and second portions of the plurality of metal pillars; and
    coupling the first substrate to a second substrate, wherein the plurality of metal pillars is disposed between the first substrate and the second substrate.

2. The method according to claim 1, further comprising:
    before the step of coupling the first substrate to the second substrate, coupling a first die to the first substrate and coupling a second die to the second substrate, wherein the first die is laterally separated from the plurality of metal pillars.

3. The method according to claim 1, wherein the step of coupling the first substrate to the second substrate comprises:
    forming a plurality of solder balls on a major surface of the second substrate; and
    coupling each of the plurality of metal pillars on the major surface of the first substrate to a solder ball of the plurality of solder balls on the major surface of the second substrate.

4. The method of claim 3, wherein the major surface of the first substrate faces towards the major surface of the second substrate.

5. The method according to claim 1, wherein the plurality of metal pillars comprises a plurality of first metal pillars, and wherein the step of coupling the first substrate to the second substrate comprises:
    forming a plurality of first portions of a plurality of second metal pillars on a major surface of the second substrate;
    forming a second portion of the plurality of second metal pillars over each of the plurality of first portions of the plurality of second metal pillars;
    forming a solder ball on each of the plurality of first metal pillars or on each of the plurality of second metal pillars; and
    coupling each of the plurality of first metal pillars to one of the plurality of second metal pillars, the solder ball disposed between each of the plurality of first metal pillars and each of the plurality of second metal pillars.

6. The method according to claim 1, wherein the step of forming the plurality of first portions of the plurality of metal pillars on the major surface of a first substrate comprises:
    forming a first layer of photoresist over the major surface of the first substrate;
    forming a plurality of first patterns in the first layer of photoresist in a perimeter region of the surface of the first substrate using a first lithography process; and
    using a first plating process to form the plurality of first portions of the plurality of metal pillars in the plurality of first patterns in the first layer of photoresist.

7. The method according to claim 6, wherein the step of forming the second portion of the plurality of metal pillars over each of the plurality of first portions of the plurality of metal pillars comprises:
    forming a second layer of photoresist over the plurality of first portions of the plurality of metal pillars and over the first layer of photoresist;
    forming a plurality of second patterns in the second layer of photoresist using a second lithography process, each of the plurality of second patterns being disposed over one of the plurality of first portions of the plurality of metal pillars;
    using a second plating process to form the second portions of the plurality of metal pillars in the plurality of second patterns in the second layer of photoresist; and
    removing the second layer of photoresist and the first layer of photoresist.

8. The method according to claim 7, wherein the step of forming the second layer of photoresist comprises forming a dry film photoresist (DFR).

9. The method according to claim 8, wherein the step of forming the DFR comprises rolling the DFR onto the plurality of first portions of the plurality of metal pillars and the first layer of photoresist in a presence of a vacuum.

10. The method according to claim 6, wherein the first plating process or the second plating process comprises an electroplating process or an electro-less plating process.

11. The method according to claim 1, further comprising encapsulating the plurality of metal pillars in a molding compound disposed between the first substrate and the second substrate.

12. A method of packaging semiconductor dies, the method comprising:
    forming a plurality of metal pillars in a first peripheral region and a second peripheral region of a first packaged die, the first packaged die having a first die in a central region disposed between the first peripheral region and the second peripheral region, wherein each of the plurality of metal pillars comprises a first portion proximal the first packaged die, the first portion formed by a first plating process, and a second portion distal the first packaged die, the second portion formed by a second plating process different from the first plating process; and
    coupling a second packaged die to the plurality of metal pillars of the first packaged die.

13. The method according to claim 12, wherein a width of the first portion of the plurality of metal pillars closest to the first packaged die is larger than a width of the second portion of the plurality of metal pillars farthest from the first packaged die.

14. The method according to claim 12, wherein the coupling the second packaged die to the plurality of metal pillars of the first packaged die comprises forming a solder joint between the second packaged die and the second portion of each of the plurality of metal pillars.

15. The method according to claim 14, wherein the solder joint partially encapsulates the second portion of a respective metal pillar of the plurality of metal pillars.

16. The method according to claim 12, wherein the first portion of each of the plurality of metal pillars comprises a height of about 1 to 60 µm, and wherein the second portion of the each of the plurality of metal pillars comprises a height of about 50 to 150 µm.

17. The method according to claim 12, wherein the second portion of each of the plurality of metal pillars comprises tapered sidewalls.

18. A method of packaging semiconductor dies, the method comprising:
    forming a plurality of metal pillars in a first peripheral region and a second peripheral region of a first packaged die, the first packaged die having a first die in a central region disposed between the first peripheral region and the second peripheral region;
    forming a protection layer over a top surface and sidewalls of each of the plurality of metal pillars;

encapsulating the plurality of metal pillars and the first die in a molding compound;

removing portions of the molding compound disposed over the top surfaces of the plurality of metal pillars and a top surface of the first die; and coupling a second packaged die to the first packaged die, wherein an air-gap is disposed between the second packaged die and the top surface of the first die.

19. The method according to claim 18, wherein the step of removing portions of the molding compound comprises at least one of a chemical-mechanical polishing process or a drilling process.

20. The method according to claim 18, wherein each of the plurality of metal pillars comprises a shape of a letter "I" in a cross-sectional view.

* * * * *